(12) United States Patent
Hosomi et al.

(10) Patent No.: US 6,552,259 B1
(45) Date of Patent: Apr. 22, 2003

(54) SOLAR CELL WITH BYPASS FUNCTION AND MULTI-JUNCTION STACKED TYPE SOLAR CELL WITH BYPASS FUNCTION, AND METHOD FOR MANUFACTURING THESE DEVICES

(75) Inventors: Shigeyuki Hosomi, Osaka-fu (JP); Tadashi Hisamatsu, Kashihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 254 days.

(21) Appl. No.: 09/691,853

(22) Filed: Oct. 18, 2000

(30) Foreign Application Priority Data

Oct. 18, 1999 (JP) .......................................... 11-295195
Sep. 20, 2000 (JP) ...................................... 2000-285274

(51) Int. Cl.⁷ ........................ H01L 31/042; H01L 31/04
(52) U.S. Cl. ....................... 136/255; 136/249; 136/252; 136/262; 257/461; 257/443; 257/448; 438/73; 438/74; 438/93; 438/514; 438/518; 438/519; 438/526; 438/527; 438/531
(58) Field of Search ................................ 136/255, 249, 136/252, 262; 257/461, 443, 448; 438/73, 74, 93, 514, 518, 519, 526, 527, 531

(56) References Cited

U.S. PATENT DOCUMENTS

| 4,665,277 A | * 5/1987 | Sah et al. ..................... 136/255 |
| 5,330,584 A | 7/1994 | Saga et al. ................... 136/255 |
| 5,580,395 A | 12/1996 | Yoshioka et al. ............ 136/255 |
| 5,609,694 A | * 3/1997 | Asai ............................. 136/255 |
| 2001/0017154 A1 | * 8/2001 | Washio ........................ 136/256 |
| 2002/0007846 A1 | * 1/2002 | Kawano ....................... 136/255 |

FOREIGN PATENT DOCUMENTS

| JP | 4-179169 A | * 6/1992 |
| JP | 5-110121 | 4/1993 |
| JP | 8-23111 A | * 1/1996 |
| JP | 8-88392 | 4/1996 |
| JP | 9-83002 | 3/1997 |
| WO | WO-96/18213 A1 | * 6/1996 |

OTHER PUBLICATIONS

Suzuki et al, "Progress and future view of silicon space solar cells in Japan," IEEE Transactions on Electron Devices, vol. 46, No. 10, Oct. 10, 1999, pp. 2126–2132.*

T. Hisamatsu et al.: "Reverse Bias Characteristics of Modules Made of Solar Cells With and Without Integrated Bypass Function (IBF)", Proceedings of 25$^{th}$ IEEE PVSC, (May 1996), pp. 251–254.

* cited by examiner

*Primary Examiner*—Alan Diamond
(74) *Attorney, Agent, or Firm*—Nixon & Vanderhye P.C.

(57) ABSTRACT

In this bypass-function added solar cell, a plurality of island-like p⁺ regions, which is third regions, are formed at a boundary between a p-type region and an n-type region layer constituting a substrate so that the p⁺ regions project into the region and the region and are separated away from the surface of the substrate. Therefore, in this solar cell, unlike prior art counterparts, the insulating film for isolating the p⁺ regions and the n electrodes constituting the np⁺ diode from one another is no longer necessary, thus allowing a reduction in manufacturing cost. As a result, a bypass-function added solar cell with a bypass-diode function added thereto can be provided with low cost and by simple process.

38 Claims, 12 Drawing Sheets

US 6,552,259 B1

SOLAR CELL WITH BYPASS FUNCTION AND MULTI-JUNCTION STACKED TYPE SOLAR CELL WITH BYPASS FUNCTION, AND METHOD FOR MANUFACTURING THESE DEVICES

BACKGROUND AND SUMMARY OF THE INVENTION

The present invention relates to solar batteries for converting optical energy into electrical energy and, more particularly, to a bypass-function added solar cell to which is added a bypass-diode function for protecting the solar cell from reverse bias voltage.

Generally, solar cells are used as a solar cell module in which a plurality of solar cells are combined together in series and parallel.

In this solar cell module, when part of the cells are shadowed, voltages generated by other cells are applied to these cells in reverse directions.

For example, in space solar cell modules, there can occur a shadow of part of the satellite body or structures such as antenna onto the solar cell module during the posture control of the satellite. Also, in ground solar cell modules, for example, shadows of neighboring buildings can occur or shadows of attached droppings of birds that have come over flying.

As an example, here is discussed a case where there has occurred a shadow onto part of partial submodules of a solar cell module which is made up of an array of parallel-connected solar cells.

Referring to FIG. 9A, in a shunt mode in which both ends of a solar cell module M are nearly short-circuited, a voltage $V_{12}$ generated by unshadowed other groups of submodules 312 is applied as a reverse bias voltage to a shadowed submodule 311. If the voltage of this submodule 311 is $V_{11}$, then $V_{11}=-V_{12}$.

As shown in FIG. 9B, when an external power supply $V_B$ is connected to a solar cell module M, it follows that $V_{11}=V_B-V_{12}$. That is, a positive voltage is applied to an N electrode of the shadowed submodule 311, where if the reverse bias voltage of the voltage is higher than the breakdown voltage of the solar cells constituting the submodule 311, the cells would break down, causing a large amount of current to flow. In this case, if a crystal defect or the like is present in a cell, the current concentrates at the place, which may lead to a short-circuit breakdown of the cell occasionally. When this occurs, the shadowed submodule and further the entire solar cell module M are deteriorated in output characteristic.

In order to prevent accidents due to the application of this reverse bias voltage, bypass diodes are attached every solar cell or every particular module units, or so-called diode-integrated solar cells in which bypass diodes are integrated on solar cells are used.

Otherwise, there have been provided solar cells with the bypass diode function added. The structure of a bypass-diode-function added solar cell according to the prior art (Japanese Patent Laid-Open Publication HEI 8-88392) is described below with reference to FIGS. 4A–4C. FIG. 4B is a plan view showing the structure of this solar cell, and FIG. 4C is a sectional view taken along the line 4C–4C' of FIG. 4B. In this solar cell, an electrically conductive region for adding a bypass diode function is provided just under the light-receiving side electrode, thus the solar cell being equipped with the bypass-diode function is obtained without reducing the effective area of the light-receiving surface of the solar cell.

As shown in FIG. 4C, a light-receiving surface on top of a silicon p-type substrate 101 is covered with a transparent antireflection film 108, and under the antireflection film 108, a comb-tooth like n electrode 107 branched from an n-electrode connecting portion 105, which is a bar electrode, is placed on an n-type region 102 on top of the p-type substrate 101. Also, as shown in FIGS. 4B and 4C, a plurality of island-like $p^+$ type regions 104 are provided just under the light-receiving electrode 107 with an insulating film 109 interposed therebetween, by which the function of such a bypass diode D as shown in FIG. 4A is added.

For this solar cell, as shown in FIG. 5B, oxide 110 is formed on the p-type substrate 101 shown in FIG. 5A. Then a plurality of openings 114 are formed in this oxide 110 as shown in FIG. 5C, and a $p^+$ impurity is injected thereinto, by which the island-like $p^+$ type regions 104 are formed as shown in FIG. 5D. Next, as shown in FIG. 5E, the n-type region 102 is formed on the top and side surfaces of the p-type substrate 101 by thermal diffusion or the like. Thereafter, as shown in FIG. 5F, the insulating film 109, the n electrode 107 and the n-electrode connecting portion 105 are formed and, further thereon, the antireflection film 108 and a rear-surface p electrode 106 are formed by vacuum deposition or the like. By cutting along both-side broken lines, the solar cell shown in FIG. 4C can be obtained.

This solar cell is connected in multiplicity in series and in parallel as shown in FIG. 9A so that desired voltage and current can be obtained. This product is used as the solar cell module M, generally.

In order to form the insulating film 109 on a plurality of island-like $p^+$-type regions 104 as in the cross-sectional structure shown in FIG. 4C, after forming the $p^+$-type regions 104, an insulating film 109 such as oxide is deposited by CVD process (Chemical Vapor Deposition Process) or the like all over the substrate surface. Thereafter, heat treatment such as RTA (Rapid Thermal Anneal) is required to compact this insulating film 109, and further a step of patterning the insulating film 109 into an island shape on the $p^+$-type regions 104 is required. As a result, there has been a problem that the manufacturing cost becomes higher.

Further, a high-precision technique is involved in the patterning of the insulating film 109 in order that the $p^+$-type regions 104 do not make contact with the light-receiving electrode 107. This poses another problem of complicated process.

Meanwhile, a manufacturing method including a steps of providing an electrically conductive type region for adding the bypass-diode function with the ion implantation process is described in Japanese Patent Laid-Open Publication HEI 5-110121. The structure of a solar cell with the bypass-diode function manufactured by this manufacturing method is shown FIG. 6 and FIGS. 7A, 7B and 7C.

In a bypass-diode function added solar cell as shown in FIGS. 7A and 7B, an n-type region 202 is formed on a p-type region 201 and a small island-like $p^+$-type region 204 is formed in this n-type region 202. Further, an n-type electrode connecting portion 205 is formed on this n-type region 202. In a solar cell shown in FIG. 7C, an island-like $p^+$-type region 204 is formed in a p-type region 201, and an n-type electrode connecting portion 205 is formed on the n-type region 202.

With regard to this solar cell, first, as shown in FIG. 8B, oxide film 209 is formed by thermal oxidation or the like all over a silicon p-type substrate 201 shown in FIG. 8A and then, as shown in FIG. 8C, a plurality of openings 214 are formed in the oxide film 209. Next, a p-type impurity is implanted into the p-type region 201 with the oxide film 209 used as a mask, and thereafter the oxide film 209 is removed, by which an island-like p$^+$-type region 204 is formed on top of the p-type substrate 201 as shown in FIG. 8D. Next, as shown in FIG. 8E, the n-type region 202 is formed by thermal diffusion or the like on the top, bottom and side surfaces of the p-type substrate 201, and further an n electrode connecting portion 205 shown in FIG. 8F and an n electrode 207 shown in FIG. 6 are formed, and thereafter an antireflection film 208 and a rear-surface p electrode 206 are formed by vacuum deposition or the like. Finally, by cutting along both-side broken lines, a solar cell having a structure shown in FIGS. 6 and 7 can be fabricated.

However, in the solar cell shown in FIGS. 7A and 7B, there is a problem that the presence of the small island-like p$^+$-type region 204, which is an electrically conductive region for adding the bypass-diode function as shown in FIG. 6, causes a reduction in the effective area of the light-receiving surface of the solar cell.

Also, in the solar cell shown in FIG. 7C, since the p$^+$ region 204 is present at the pn junction interface, which is important for photoelectric conversion, minority carriers generated in the p region 201 are inhibited from being effectively collected to the n region. This causes a problem of deteriorated electrical output characteristics.

In view of these and other problems, an object of the present invention is to provide a bypass-function added solar cell, as well as a method for manufacturing the solar cell, which makes it possible to manufacture a solar cell with an effective bypass-diode function added thereto, with low cost and by simpler process and without reducing the effective area of the light-receiving surface of the solar cell.

In order to achieve the above object, there is provided a bypass-function added solar cell comprising:
  a first-conductive-type first region;
  a second-conductive-type second region formed on a light-receiving surface side of the first-conductive-type first region;
  a first-conductive-type third region which is formed at part of a pn junction plane where the first region and the second region abut on each other so that the third region is stretched over the first region and the second region, that is, projected into both the first region and the second region, the third region being higher in impurity concentration than the first-conductive-type first region.

In this invention, the third region is formed at the boundary of the first-conductive-type first region and the second-conductive-type second region so as to be separated away from the surface of the light-receiving surface side surface of the second region. Therefore, in this invention, unlike the prior-art counterparts, the insulating film for isolating the first-conductive-type third region constituting the diode and the electrodes formed on the light-receiving surface side surface of the second region from one another is no longer necessary. Therefore, the solar cell of this invention, with a bypass-diode function added thereto, can be manufactured without reducing the effective area of the light-receiving surface, with low cost and by simple process.

In one embodiment of the present invention, a plurality of the first-conductive-type third region are provided.

In this embodiment, since a plurality of first-conductive-type third regions are provided, it follows that a plurality of np diodes exerting the bypass function can be contained. Thus, the reverse current can be distributively passed so that the possibility of partial breakdown due to current concentration can be reduced.

In one embodiment of the present invention, the light-receiving surface side electrode in abutment on part of the second region is formed just above the third region.

In this embodiment, since the light-receiving surface side electrodes are formed just above the third regions, third regions that cannot effectively convert light are preparatorily contained in the shadow portion due to the light-receiving surface side electrodes. Therefore, the solar cell as a whole can exert photoelectric conversion effectively.

In one embodiment of the present invention, in the ion implantation step, ion implantation is performed with a photosensitive resin used as a masking material to thereby form the third region formed into an island shape.

In this embodiment, since the first-conductive-type third regions are distributed in a dotted or linear shape, the bypass-diode function can be distributed efficiently to a broad area.

Also, there is provided a method for manufacturing the bypass-function added solar cell, comprising:
  an ion implantation step of implanting ions into the first-conductive-type first region to thereby form the first-conductive-type third region higher in impurity concentration than the first-conductive-type first region at part of a pn junction plane of the first region and the second region so that the third region is projected into both the first region and the second region.

In this manufacturing method of this invention, by the ion implantation step of implanting ions into the first-conductive-type first region, the first-conductive-type third region higher in impurity concentration than the first-conductive-type first region is formed at part of the pn junction plane of the first region and the second region. As a result, the insulating film for isolating the third regions and the electrodes formed on the light-receiving surface side surface of the second region from one another is no longer necessary. Thus, a solar cell with the bypass-diode function added thereto can be provided with low cost and by simple process.

In one embodiment of the present invention, in the ion implantation step, any one of boron, gallium, aluminum and indium is used as a doping material.

In the manufacturing method of this embodiment, by the ion implantation step using any one of boron, gallium, aluminum and indium as a doping material, the first-conductive-type third regions can be formed at part of the pn junction plane of the first region and the second region so as to project into both the first region and the second region.

In one embodiment of the present invention, the method further comprises, after the ion implantation step, forming the second-conductive-type second region by thermal diffusion process and, simultaneously therewith, activating the third region.

In this manufacturing method of this embodiment, the second-conductive-type second region is formed by thermal diffusion process and, simultaneously therewith, activating the third region. Thus, the method becomes a highly efficient manufacturing method.

In one embodiment of the present invention, in the ion implantation step, ion implantation is performed with a photosensitive resin used as a masking material to thereby form the third region formed into an island shape.

In this embodiment, by performing ion implantation into the first region with a photosensitive resin used as a mask, the third region can be formed into a desired pattern.

In one embodiment of the present invention, in the ion implantation step, an ion beam controlled to a specified area is implanted to thereby form the third region.

In this embodiment, since ion implantation is done in a beamed manner by an ion implantation process with the beam throttled to a area over which the third region is formed, photosensitive resins are no longer necessary so that the manufacturing process of the solar cell can be more simplified.

Thus, with the solar cell manufacturing method of the present invention, a solar cell which is unlikely to be subject to the occurrence of short-circuit breakdown due to the reverse bias voltage can be manufactured with low cost. In particular, in the case of, for example, a space solar cell array which is difficult to maintain, remarkable effects can be produced for the protection against the reverse bias voltage, so that the reliability as a whole array can be improved. Also, since externally provided bypass diodes are not required, the manufacturing cost for the solar cell can be reduced.

Also, there is provided a bypass-function added multi-junction stacked type solar cell in which the bypass-function added solar cell of this invention is stacked, in a plural number as sub-cells, in series along a direction of incidence of light.

In the multi-junction stacked type solar cell of this invention, since a plurality of sub-cells are stacked in series along the direction of incidence of light, a high conversion efficiency can be achieved.

Also, the bypass-function added multi-junction stacked type solar cell of one embodiment includes the bypass-function added solar cell of this invention in which is the bypass-function added solar cell is stacked in a plural number as sub-cells in series along a direction of incidence of light and in which the light-receiving surface side electrodes in abutment on part of the second region are formed just above the third regions.

In the multi-junction stacked type solar cell of this embodiment, since a plurality of the sub-cells are stacked in series along the direction of incidence of light, a high conversion efficiency can be achieved. Also, since the bypass-function added solar cell in which the light-receiving surface side electrodes in abutment on part of the second region are formed just above the third regions is included, third regions that cannot effectively convert light are preparatorily contained in the shadow portion due to the light-receiving surface side electrodes. Therefore, the solar cell as a whole can exert photoelectric conversion effectively.

In one embodiment of the present invention, active layer portions of the solar cells as sub-cells are made of a group III-V compound semiconductor and the substrate is made from Ge or a group III-V compound semiconductor wafer.

In this embodiment, using group III-V compounds for the active layer part makes it possible to easily change the forbidden band width Eg and the lattice constant, and using Ge or a group III-V compound semiconductor for the substrate makes it possible to take lattice matching.

In one embodiment of the present invention, the number of third regions differ from sub-cell to sub-cell.

In this embodiment, since the number of third regions differs from sub-cell to sub-cell, a desired bypass ability can be set for each of the sub-cells according to the reverse I–V characteristics of the sub-cells in the dark state while suppressing any reduction in effective area.

In one embodiment of the present invention, a number of third regions formed in a top cell positioned closest to the light-receiving surface is the largest among the sub-cells.

In this embodiment, since the number of third regions formed in the top cell positioned closest to the light-receiving surface is the largest among the sub-cells, a bypass ability can be set so as to be ready for cases where a relatively large-area shadow occurs to this solar cell. The reason of this is that when a large-area shadow occurs, it is often the case that a reverse bias voltage is applied to the top cell.

In one embodiment of the present invention, a number of third regions formed in a sub-cell that is the smallest in production current density during photo-irradiation is the largest.

In this embodiment, since the number of third regions formed in a sub-cell that is the smallest in production current density during photo-irradiation is the largest, a bypass ability can be set so as to be ready for cases where light is irradiated to part of this MJ stacked type solar cell. The reason of this is that when a reverse bias voltage is applied with light impinging on part of the MJ cell, it is often the case that the reverse bias voltage is applied to a cell that is relatively small in photoproduction current amount.

In one embodiment of the present invention, positions on cell planes where the third regions are formed are uniform regardless of positions of the light-receiving surface side electrodes.

In this embodiment, since the positions on cell planes where the third regions are formed are uniform regardless of the positions of the light-receiving surface side electrodes, the bypass diode function can be distributed efficiently to a broad area.

In one embodiment of the present invention, positions on cell planes where the third regions are formed are positions under the light-receiving surface side electrodes.

In this embodiment, since the positions on cell planes where the third regions are formed are positions under the light-receiving surface side electrodes, third regions that cannot effectively convert light are preparatorily contained in the shadow portion due to the light-receiving surface side electrodes. Therefore, the solar cell as a whole can exert photoelectric conversion effectively.

In one embodiment of the present invention, among the individual sub-cells, positions where the third regions are formed on their cell planes are positions different from one another under the light-receiving surface side electrodes.

In this embodiment, among the individual sub-cells, the positions where the third regions are formed on their cell planes are positions different from one another under the light-receiving surface side electrodes. Therefore, the controllability of ion implantation depth for the formation of the third region can be improved.

In one embodiment of the present invention, the multi-junction solar cell of this invention further comprises the step of: after forming the third regions at positions under the light-receiving surface side electrodes, activating these third regions by beam annealing.

In this embodiment, since the third regions are activated by beam annealing, the rate of activation of implanted ions can be enhanced.

In one embodiment of the present invention, ion implantation material is one or a plurality of Be, Cd, Mg, Zn and C, or a combination of one or a plurality of Be, Cd, Mg, Zn and C and one of B, Al, Ga and In.

In this embodiment, it is effective to implant ions of Be, Cd, Mg, Zn or C for the formation of the $p^+$ region as the third region in the group III-V compound semiconductor, and it is effective to implant ions of a group III element such as B, Al, Ga and In for the formation of the $p^+$ region in the Ge substrate.

In one embodiment of the present invention, ion implantation material is one or a plurality of S, Se, Te and Si, or a combination of one or a plurality of S, Se, Te and Si and one of N, P, As and Sb.

This embodiment is effective for cases where the n+ region as the third region is formed in a solar cell having a "p on n" construction as viewed from the light-receiving surface side.

As apparent from the above description, according to the present invention, it becomes to add a desired bypass function to the MJ solar cell, contributing to reliability improvement as well as manufacturing cost reduction of the solar cell array using a high efficiency solar cell.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Hereinbelow, the present invention is described in detail by way of embodiments thereof illustrated in the accompanying drawings.

First Embodiment

Figure 1:
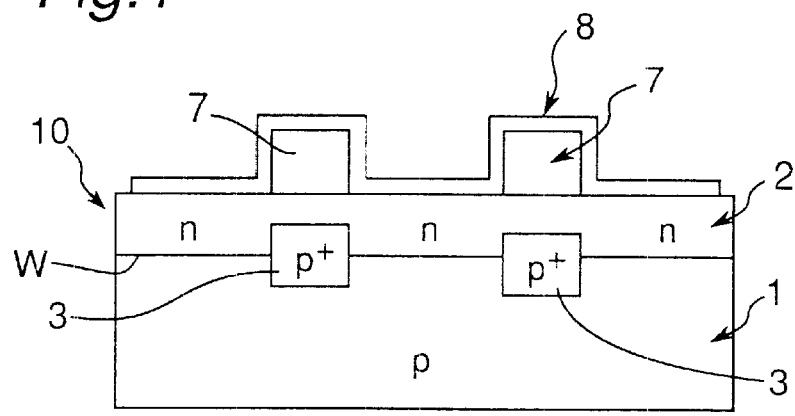
FIG. 1 is a cross-sectional schematic view showing an embodiment of the bypass-function added solar cell of the present invention.
Figure 2:
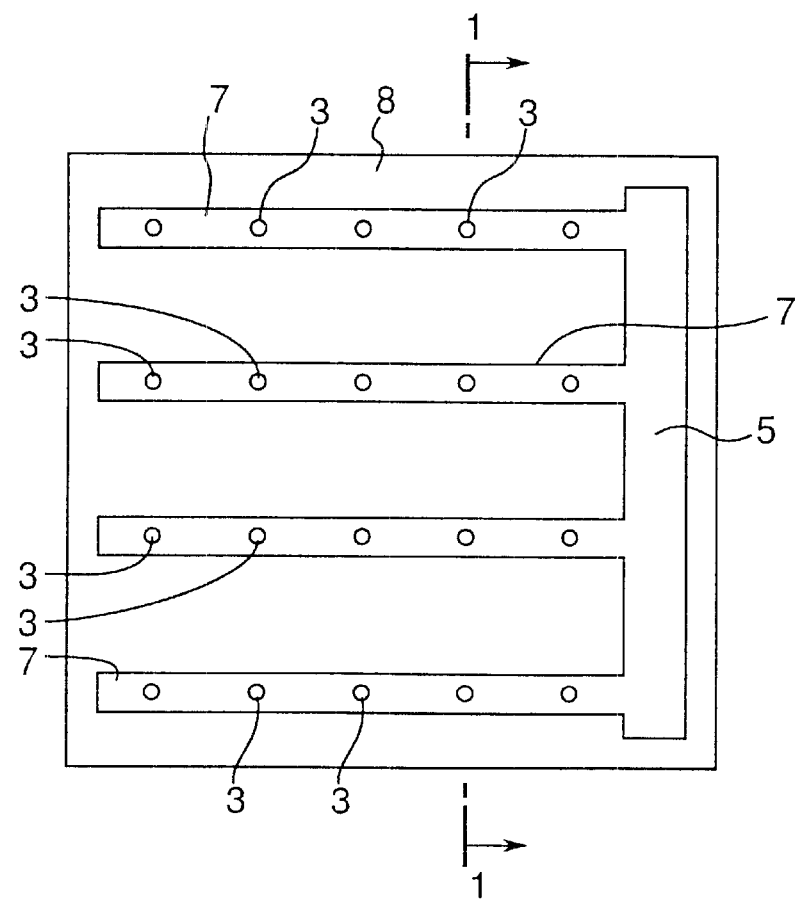
FIG. 2 is a plan view of the bypass-function added solar cell of the embodiment.

FIGS. 1 and 2 show the constitution of an embodiment of the bypass-function added solar cell according to the present invention. FIG. 2 is a plan view showing the structure of the solar cell of this embodiment, and FIG. 1 is a sectional view taken along the line 1–1' of FIG. 2. As shown in FIG. 1, an n-type region layer 2 is formed on the surface of a p-type region 1, thus constituting a substrate 10. A plurality of island-like p+ regions 3 are formed so as to stretch over part of a pn junction plane at which the P-type region 1 and the n-type region layer 2 abut on each other. On the n-type region layer 2, a plurality of n electrodes 7, 7, . . . are formed at regions upwardly opposite to the plurality of island-like p+ regions 3. Therefore, the island-like p+-type regions 3 to constitute this bypass diode never reduce the effective area of the light-receiving surface of the solar cell.

The plurality of n electrodes 7, 7, . . . have a comb-tooth shape as viewed from the top, as shown in FIG. 2. These comb-tooth shaped n electrodes 7, 7, . . . are connected to one another at an n electrode connecting portion 5. Also, as shown in FIG. 1, these comb-tooth shaped n electrodes 7, 7, . . . are covered with an antireflection film 8. Although not shown, a p electrode is provided on the rear surface of the p-type region 1, as in the prior-art example.

As shown in FIG. 1, the plurality of island-like p+-type regions 3, which is a third region, are formed at the pn junction plane between the p-type region 1 and the n-type region layer 2 constituting the substrate 10, being spaced from the top surface of the substrate 10. Accordingly, in this first embodiment, unlike the prior art example, an insulating film for separating the p+-type regions 3 and the n electrodes 7, which constitute an np+ diode, from each other is no longer necessary, thus contributing to a reduction in process and making it possible to reduce the manufacturing cost.

The plurality of island-like p+-type regions 3, which is the third region, are higher in impurity concentration than the p-type region 1 of the substrate 10. By the pn junction between these island-like p+-type regions 3 and n-type region layer 2, is generated a breakdown due to the avalanche effect. In order to generate this breakdown, the impurity concentration of the p+ regions 3 should be $1 \times 10^{18}$ cm$^{-3}$ or more.

The manufacturing process of this solar cell is explained by sequentially referring to the cross-sectional schematic views for individual steps of FIGS. 3A–3D.

Figure 3A:
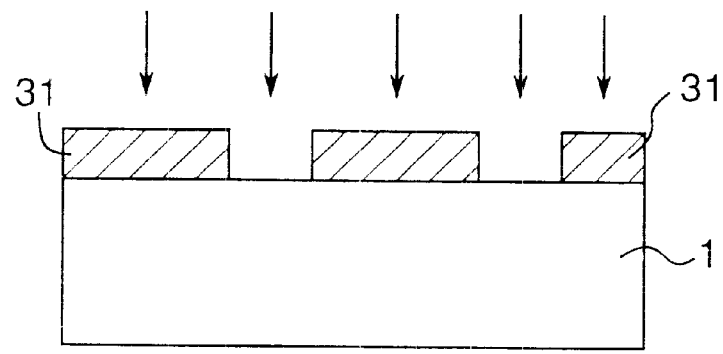
FIGS. 3A–3D are sectional views in the sequence of process steps showing the manufacturing process of the embodiment in order.

First, as shown in FIG. 3A, photoresist 31 is applied onto the light-receiving surface of a P-type silicon substrate 1 and patterned so as to be opened at regions opposite to positions where the island-like p+-type regions 3 are to be formed.

Figure 3B:
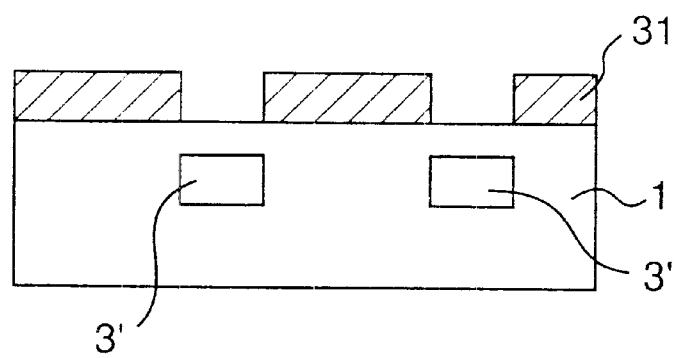

Next, with the photoresist 31 used as a mask, boron as a dopant is ion implanted into the p-type silicon region 1 at an energy level of about 50–100 keV to a proper depth corresponding to the boundary of pn junction so that the impurity concentration becomes about $1 \times 10^{18}$ cm$^{-3}$ as an example. By this ion implantation, p+-type regions 3' are formed at places spaced away from the surface and serving as the boundary of pn junction as shown in FIG. 3B. This pn junction boundary is a boundary W between the p-type region 1 and the n-type region layer 2 of the substrate 10 in FIG. 1.

By forming a plurality of p+-type regions 3' as shown in FIG. 3B, a reverse current can be distributively passed. This bypass function reduces the possibility of partial breakdown. It is noted that as the dopant, gallium, aluminum or indium may also be used instead of boron.

Figure 3C:
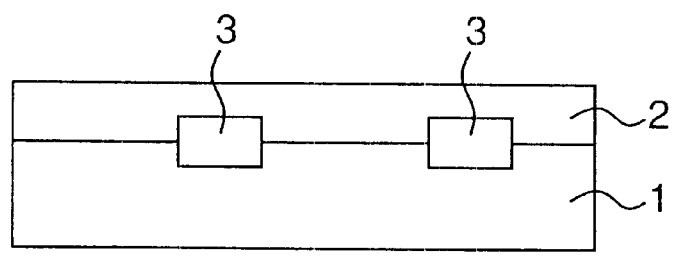

Next, as shown in FIG. 3C, the n-type region layer 2 is formed on top of the p-type silicon substrate 1 by thermal diffusion or the like. Simultaneously with this, crystal defect recovery and activation of the p$^+$-type regions 3' which have been formed by ion implantation in the vicinity of the boundary of pn junction and which have not yet been activated are performed, by which the p$^+$-type regions 3 are completed. In this way, since the p$^+$-type regions 3' that have not yet been activated are activated simultaneously with the formation of the n-type region layer 2 by thermal diffusion process, the manufacturing process becomes higher in efficiency.

Thereafter, the light-receiving surface side n-type region 2 is coated with an acid-proof resin such as photoresist and, thereafter, a n-type diffusion layer (not shown) formed at the rear and side surfaces of the p-type silicon substrate 1 is removed by, for example, fluoro-nitric acid.

Figure 3D:
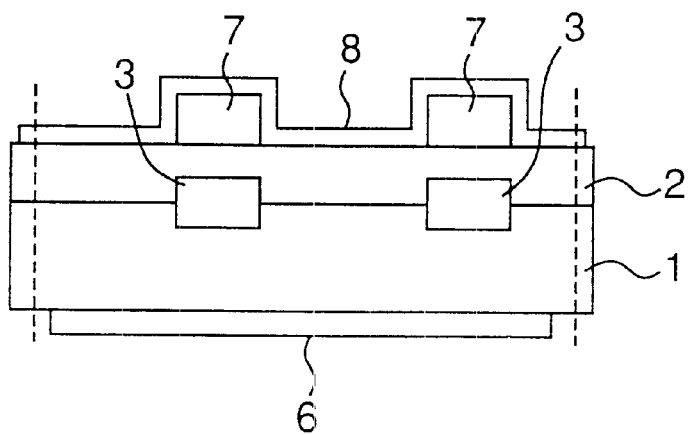
Figure 4A:
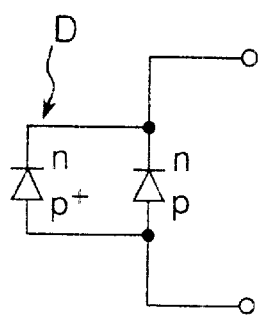
FIG. 4A is an equivalent circuit diagram of a bypass-function added solar cell.
Figure 4B:
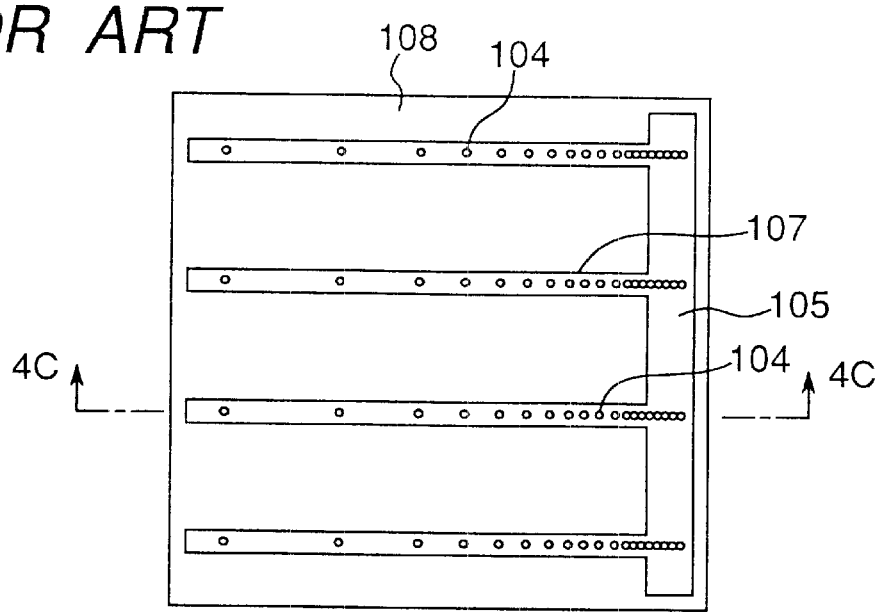
FIG. 4B is a plan view of a prior-art bypass-function added solar cell (Japanese Patent Laid-Open Publication HEI 8-88392) and FIG. 4C is a sectional view taken along the line 4C–4C' of FIG. 4B.
Figure 4C:
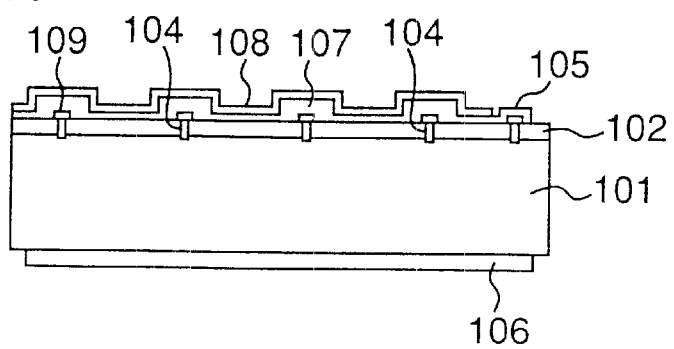
Figure 5A:
FIGS. 5A–5F are sectional views showing the manufacturing process of the prior-art bypass-function added solar cell in process sequence.
Figure 5B:
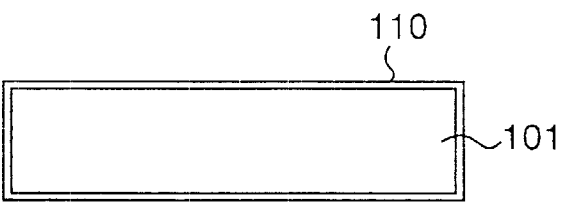
Figure 5C:
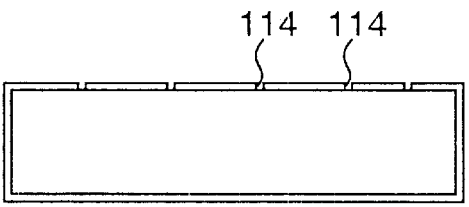
Figure 5D:
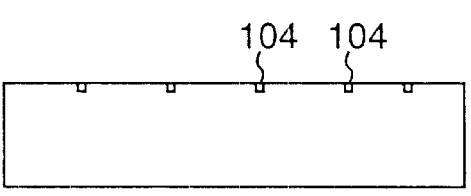
Figure 5E:
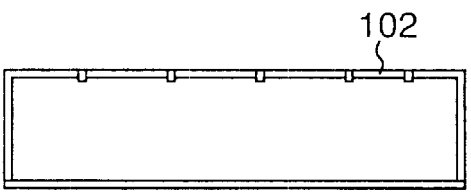
Figure 5F:
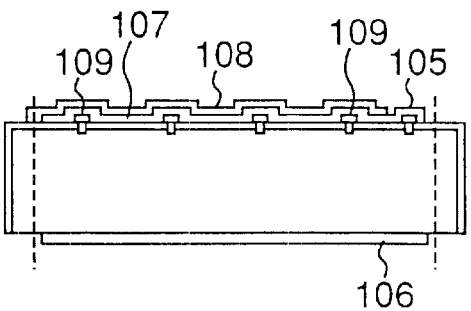
Figure 6:
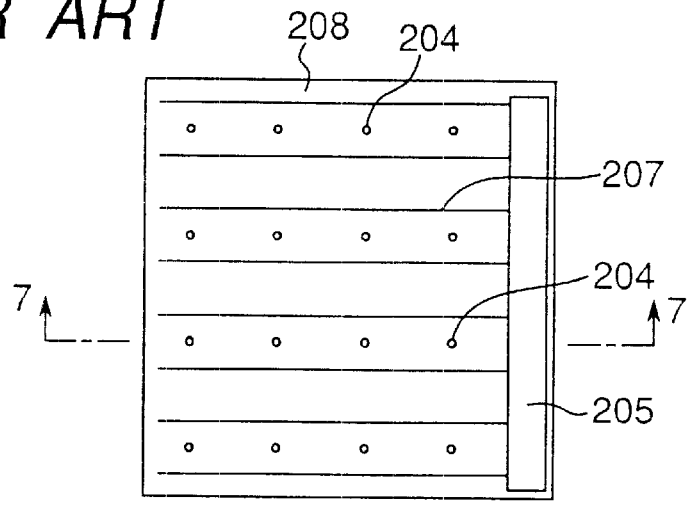
FIG. 6 is a plan view of another prior-art bypass-function added solar cell (Japanese Patent Laid-Open Publication HEI 5-110121)
Figure 7A:
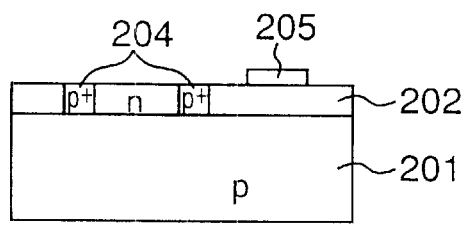
FIGS. 7A, 7B and 7C are sectional views showing an example of the cross section taken along the line 7–7' of FIG. 6.
Figure 7B:
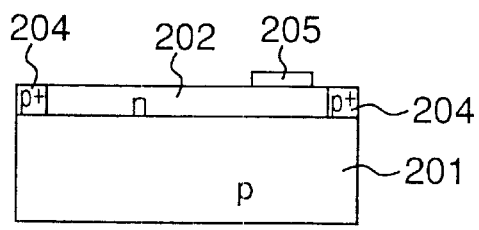
Figure 7C:
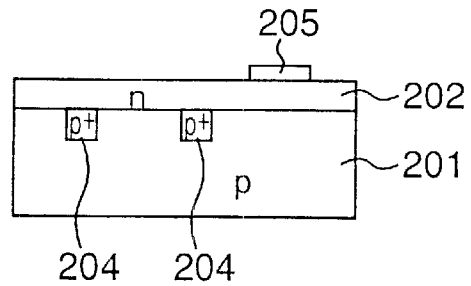
Figure 8A:
FIGS. 8A–8F are sectional views in the sequence of process steps showing the manufacturing process of the solar cell shown in FIGS. 6 and 7.
Figure 8B:
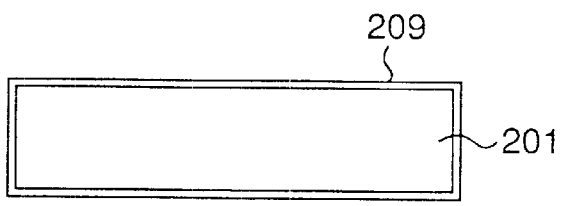
Figure 8C:
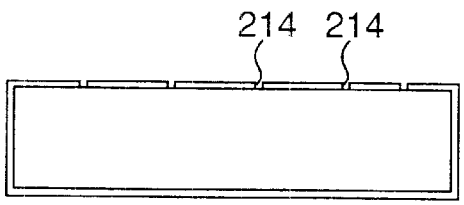
Figure 8D:
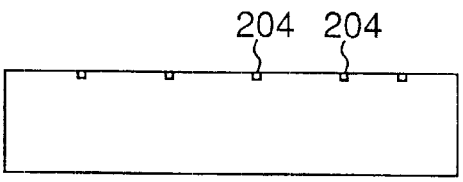
Figure 8E:
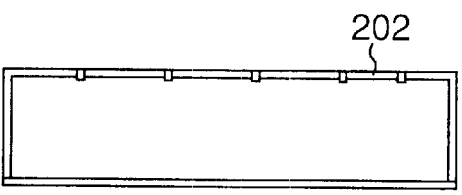
Figure 8F:
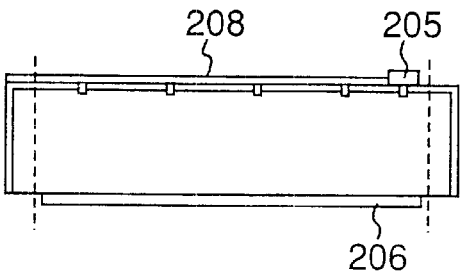
Figure 9A:
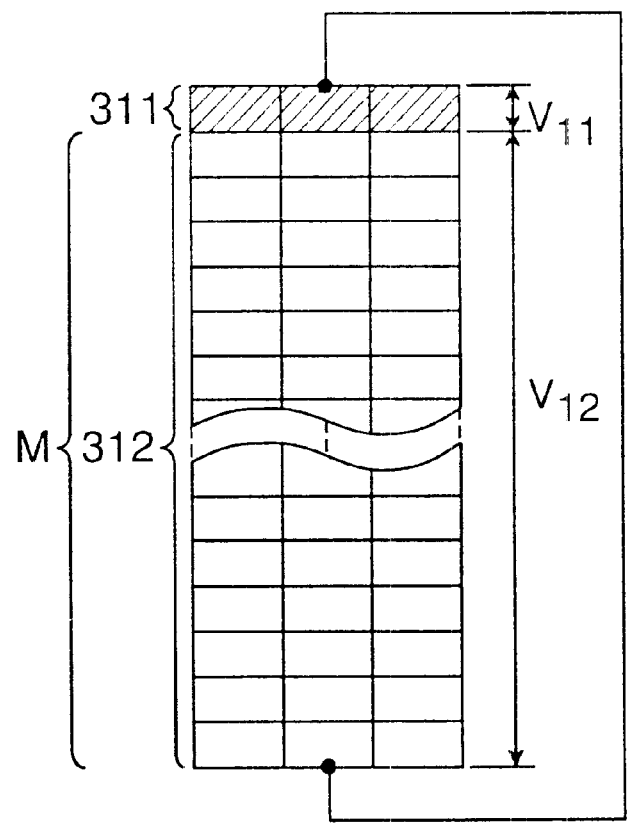
FIG. 9A shows an example of the constitution of the solar cell module, being an explanatory view showing how a reverse bias voltage is applied to solar cells.
Figure 9B:
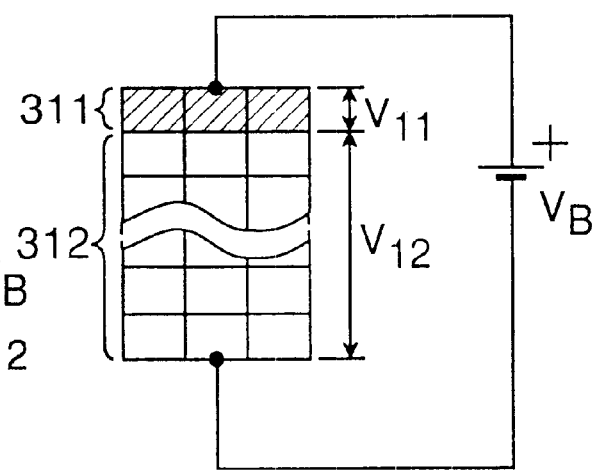
FIG. 9B is an explanatory view showing how external power supply is connected to the solar cell module.

Next, as shown in FIG. 3D, comb-tooth like n electrodes 7 are formed on the top surface of the n-type region 2, which serves as the light-receiving surface. These comb-tooth like n electrodes 7 are formed in regions opposite to the p$^+$ regions 3. Further, an antireflection film 8 is formed on these comb-tooth like n electrodes 7 and the n-type region 2 by vacuum deposition process or the like, and a p electrode 6 is formed on the rear surface of the p-type silicon substrate 1 by vacuum deposition process or the like.

Next, by cutting along both-end broken lines shown in FIG. 3D, a solar cell shown in FIGS. 1 and 2 is obtained. In this embodiment, since the n electrodes 7 are formed above the p$^+$-type regions 3, p$^+$-type regions 3 that cannot convert light effectively are preparatorily contained in portions shadowed by the n electrodes 7. Therefore, the solar cell as a whole is capable of effectively receive light. Also, with an arrangement that the p$^+$-type regions 3 constituting a bypass diode are formed in a dotted or linear pattern under the electrode pattern of the n electrodes 7 as shown in the plan view of FIG. 2, regions under the n electrodes 7 can be used effectively.

As a masking material, photosensitive resin such as photoresist film is used in this manufacturing process. However, without using any masking material, ion implantation may also be performed to specified places by an ion implantation process using a beam throttled to an area where the p$^+$-type regions 3 are to be formed. In this case, the photoresist film is no longer necessitated and the manufacturing process of the solar cell can be simplified. As ion implantation conditions in this case, boron as an example is ion implanted at an energy level of about 50–100 keV so that the impurity concentration becomes higher than $1\times10^{18}$ cm.$^{-3}$.

Although this embodiment has been described with respect to a solar cell using a p-type silicon substrate, yet the present invention can basically be applied to solar cells using an n-type silicon substrate or substrates of GaAs or the like other than silicon single crystal. With an n-type silicon substrate used, a first region, a second region and a third region are formed with a doping material having a conductive type opposite to that of the case in which a p-type silicon substrate is used. For example, phosphorus, arsenic and antimony are available as a doping material for forming the third region. The present invention is also applicable to either space solar batteries or ground solar batteries.

Second Embodiment

Next, a second embodiment, which is a bypass-function added MJ stacked type solar cell of the present invention, is described. This second embodiment is characterized in that a bypass function is added to multi-junction solar cells (hereinafter, referred to as MJ cell) having a plurality of pn junctions connected in series and being stacked one on another.

Figure 10:
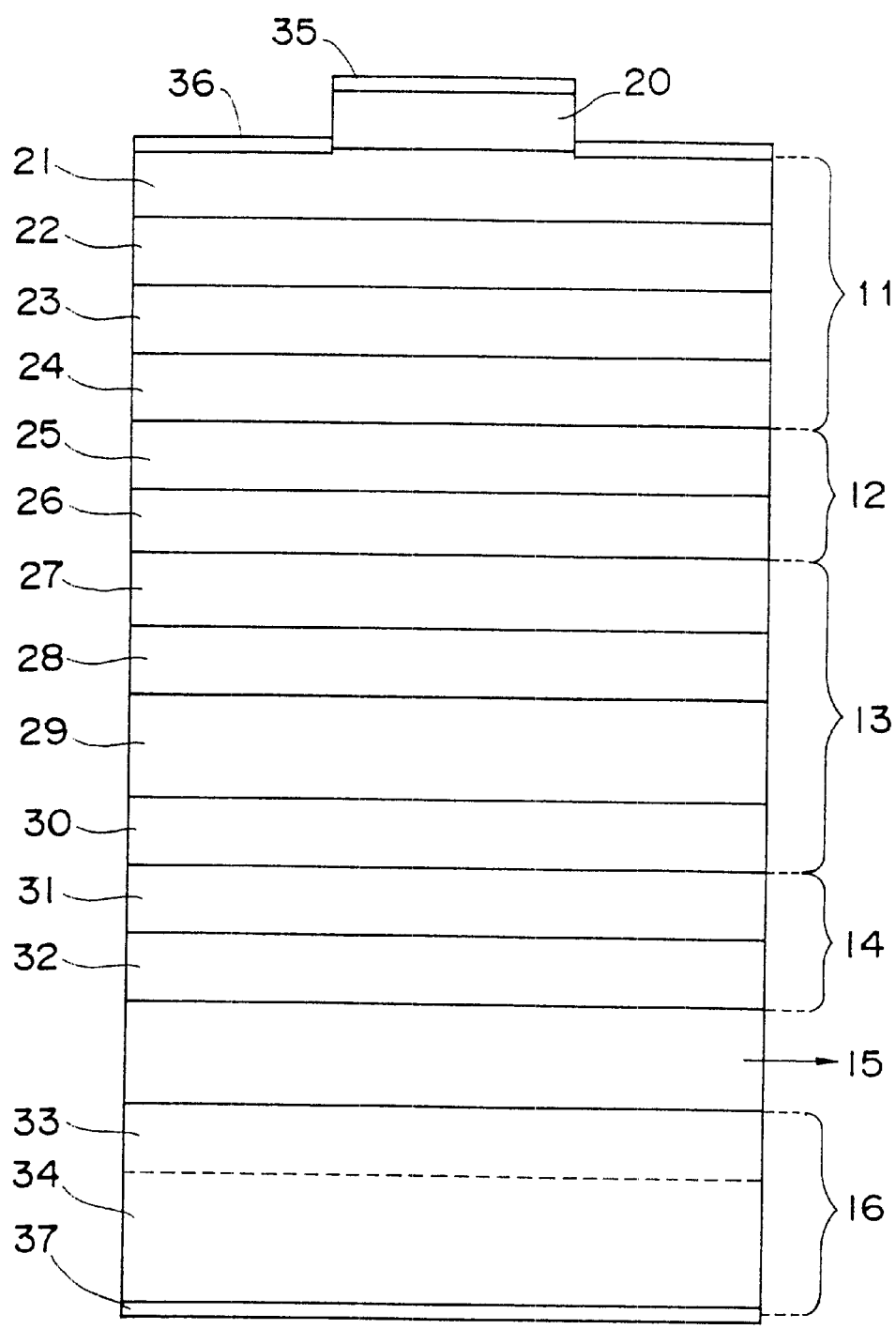
FIG. 10 is a sectional view showing an example of the structure of an MJ (Multi-Junction) solar cell, which is a prerequisite constitution of a second embodiment of the present invention.

First, with reference to FIG. 10, an example of the cross-sectional structure of a general MJ cell, which is the prerequisite constitution of this second embodiment. This MJ cell has, on a Ge single crystal substrate, a GaInP top cell 11, a GaAs middle cell 13 and a Ge bottom cell 16 made within the substrate, all of which are different from one another in wavelength sensitivity region. These top cell 11, middle cell 13 and bottom cell 16 are sub-cells included in the MJ cell. These sub-cells 11, 13, 16 are connected monolithically in series to one another via tunnel junctions 12, 14.

That is, as shown in FIG. 10, this MJ cell has a structure in which an n$^+$-GaAs layer 20, an n-AlInP layer 21, an n-GaInP layer 22, a p-GaInP layer 23, a p-AlGaInP layer 24, a p$^{++}$-GaAs layer 25, an n$^{++}$-GaAs layer 26, an n-GaInP layer 27, an n-GaAs layer 28, a p-GaAs layer 29, a p-GaInP layer 30, a p$^{++}$-GaAs layer 31, an n$^{++}$-GaAs layer 32, a buffer layer 15, an n-Ge layer 33, a p-Ge substrate 34 are connected in series in this order. An n-side electrode 35 is formed on the top surface of the n$^+$-GaAs layer 20, and a p-side electrode 37 is formed on the rear surface of the p-Ge substrate 34. Further, an antireflection film 36 is formed on the part of the top surface of the n-AlInP layer 21 where the n$^+$-GaAs layer 20 is not formed.

As shown in FIG. 10, the n-AlInP layer 21, the n-GaInP layer 22, the p-GaInP layer 23 and the p-AlGaInP layer 24 constitute the top cell 11. Also, the n-GaInP layer 27, the n-GaAs layer 28, the p-GaAs layer 29 and the p-GaInP layer 30 constitute the middle cell 13. These middle cell 13 and the top cell 11 are connected to each other by the tunnel junction 12 composed of the p$^{++}$-GaAs layer 25 and the n$^{++}$-GaAs layer 26.

The n-Ge layer 33 and the p-Ge substrate 34 constitute the bottom cell 16. This bottom cell 16 and the middle cell 13 are connected to each other by the tunnel junction 14 and the buffer layer 15. This tunnel junction 14 is composed of the p$^{++}$-GaAs layer 31 and the n$^{++}$-GaAs layer 32.

In the MJ cell made up from a combination of these materials, a high conversion efficiency of about 27% can be expected.

Such an MJ cell, which is made up from a combination of semiconductor materials that differ in forbidden band width Eg from one another, is formed by epitaxial growth intended for lattice matching with the substrate, generally. In particular, with the use of mixed crystal materials, group III-V compounds that can easily be changed in forbidden band width Eg and lattice constant are used for the active layer, while Ge that can be lattice matched with GaAs, which is a typical semiconductor of group III-V compound, is used for the substrate.

As an example, here is explained a GaInP/GaAs/Ge tri-junction cell below. However, the invention is not limited to cells in combinations of these materials. Further, this second embodiment, although basically of an "n on p" construction as viewed from the light-receiving surface side, yet may be of a "p on n" construction without being limited to the "n on p" construction.

The sub-cells 11, 13, 16 constituting the MJ cell differ in constituent material from one another, and so differs in reverse current-voltage characteristics (I–V characteristics) in dark state. Also, the sub-cells 11, 13, 16 differ in wavelength sensitivity region from one another, and therefore, generally, differ also in photoproduction current density from one another. When a reverse bias voltage is applied to this MJ cell from external, the reverse bias voltage is not uniformly applied but applied primarily to sub-cells through which it is the most difficult for the reverse current to flow in that state.

That is, in the state that the MJ cell is fully covered with a shadow, when a reverse bias voltage is applied to the MJ cell, this reverse bias voltage is applied to the sub-cell that is the smallest in reverse current in the dark state, i.e., in many cases, to the GaInP top cell 11 having the largest forbidden band width Eg. Also, in a state that light is impinging on part of the MJ cell, when the reverse bias voltage is applied, it is often the case that the reverse bias voltage is applied to the GaAs middle cell 13, which is relatively small in photoproduction current.

Like this, in the MJ cell, the sub-cell to which the reverse bias voltage is applied differs depending on the state of photo-irradiation at the time when the reverse bias voltage is applied thereto. Therefore, ideally, it is necessary to add the bypass function to all the sub-cells 11, 13, 16.

In this case, with the use of ion implantation process, a p region as the third region can easily be formed at the pn junction planes of all the sub-cells 11, 13, 16 by properly selecting an ion seed and an acceleration voltage.

The reverse bias voltage to be actually applied to the cell, in many cases, can be predicted from the circuitry of the module. Based on the predicted reverse bias voltage, the necessary number of $p^+$ regions and the carrier concentration can be determined for each sub-cell. Like this, even when an MJ cell having different desired numbers of $p^+$ regions and carrier concentrations from sub-cell to sub-cell is fabricated, using ion implantation process allows the number of $p^+$ regions and the carrier concentration to be freely controlled.

Figure 11:
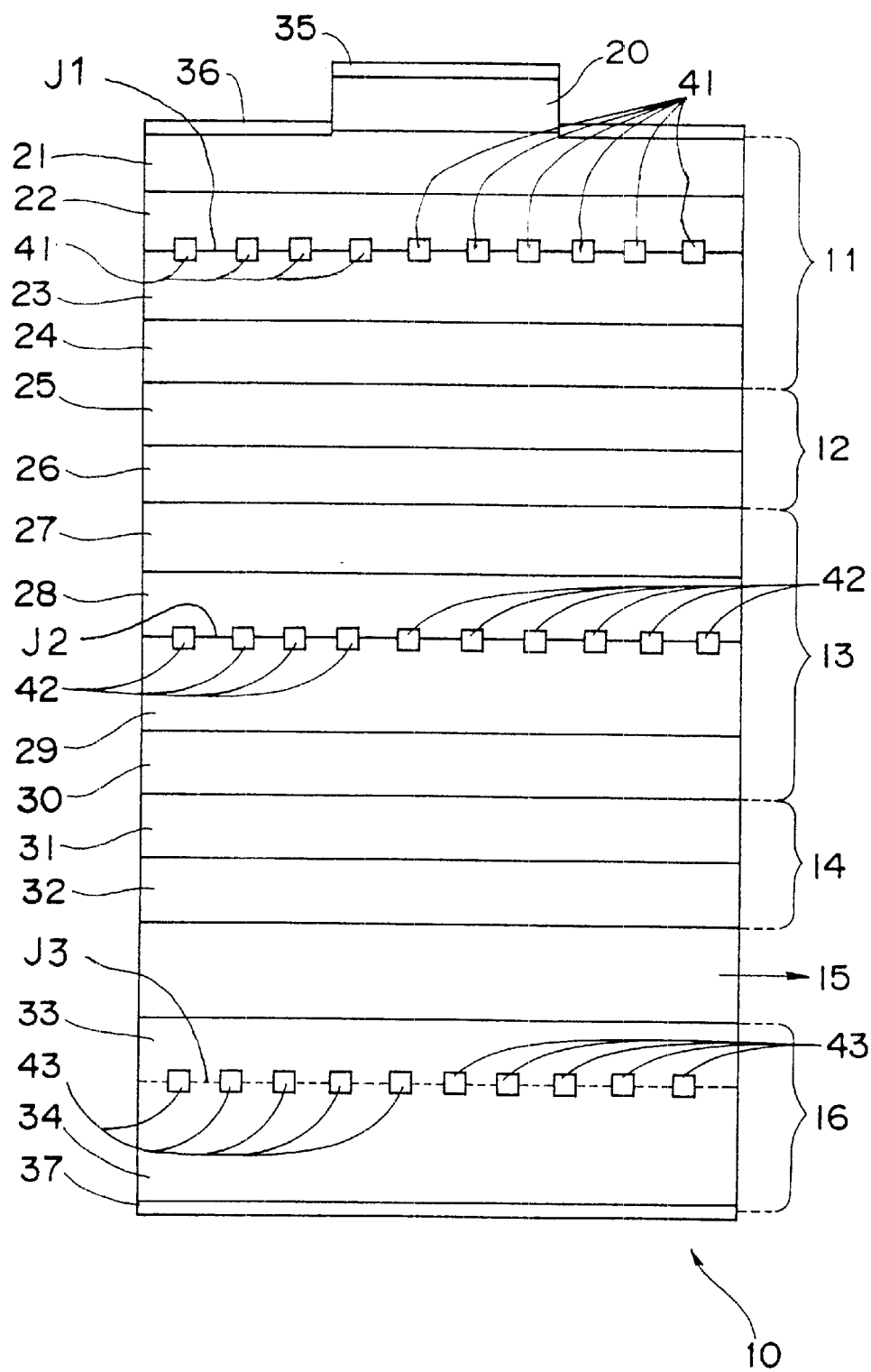
FIG. 11 is a sectional view of a bypass-function added MJ stacked type solar cell of the second embodiment.

Next, FIG. 11 shows the constitution of this second embodiment. In this second embodiment, island-like $p^+$ regions 41, 42, 43 of the same number (ten) are formed in all the sub-cells 11, 13, 16.

That is, in this second embodiment, the top cell 11 has ten $p^+$ regions 41 formed at a pn junction plane J1 of the n-GaInP layer 22 and the p-GaInP layer 23. The middle cell 13 has ten $p^+$ regions 42 formed at a pn junction plane J2 of the n-GaAs layer 28 and the p-GaAs layer 29. The bottom cell 16 has ten $p^+$ regions 43 formed at a pn junction plane J3 of the n-Ge layer 33 and the p-Ge substrate 34. These each ten $p^+$ regions 41, 42, 43 are arrayed in the pn junction planes at generally equal intervals, respectively.

In the MJ cell 10 of this second embodiment, all the sub-cells 11, 13, 16 can be protected from reverse bias.

On the other hand, in this second embodiment, the ion implantation process for forming the each ten $p^+$ regions 41, 42, 43 requires rather long time and labor. In this respect, the following third embodiment is effective.

Third Embodiment

Figure 12:
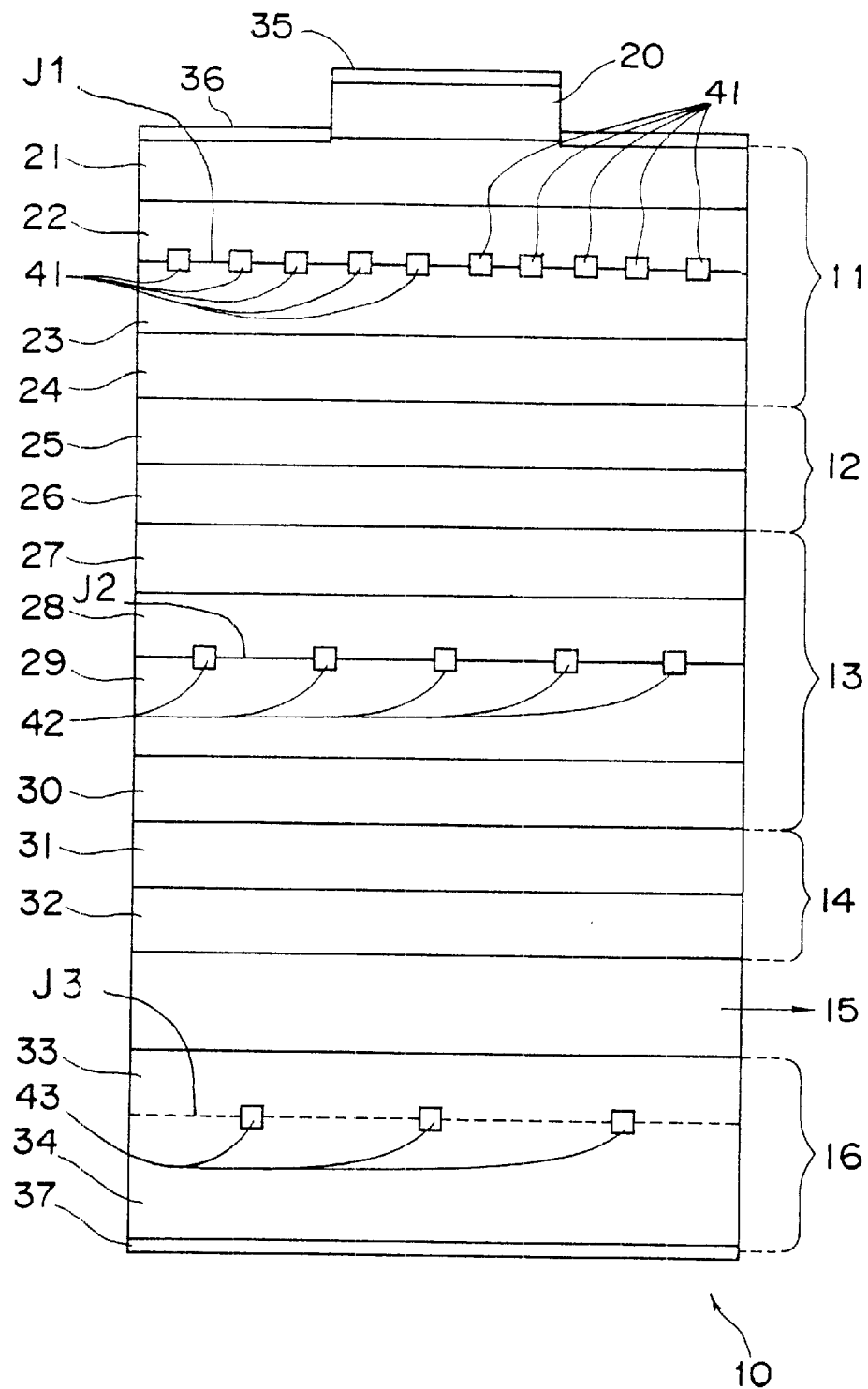
FIG. 12 is a sectional view of a bypass-function added MJ stacked type solar cell which is a third embodiment of the present invention.

In this third embodiment, as shown in FIG. 12, the top cell 11 has the most ten $p^+$ regions 41. The middle cell 13 has the second most five $p^+$ regions 42. The bottom cell 16 has the least three $p^+$ regions 43. Otherwise, the constitution is the same as in the second embodiment.

This third embodiment is effective, for example, when a shadow of a relatively large area occurs onto the solar cell module. This is because when a large-area shadow occurs, a reverse bias voltage is, in many cases, applied to the top cell.

Fourth Embodiment

Figure 13:
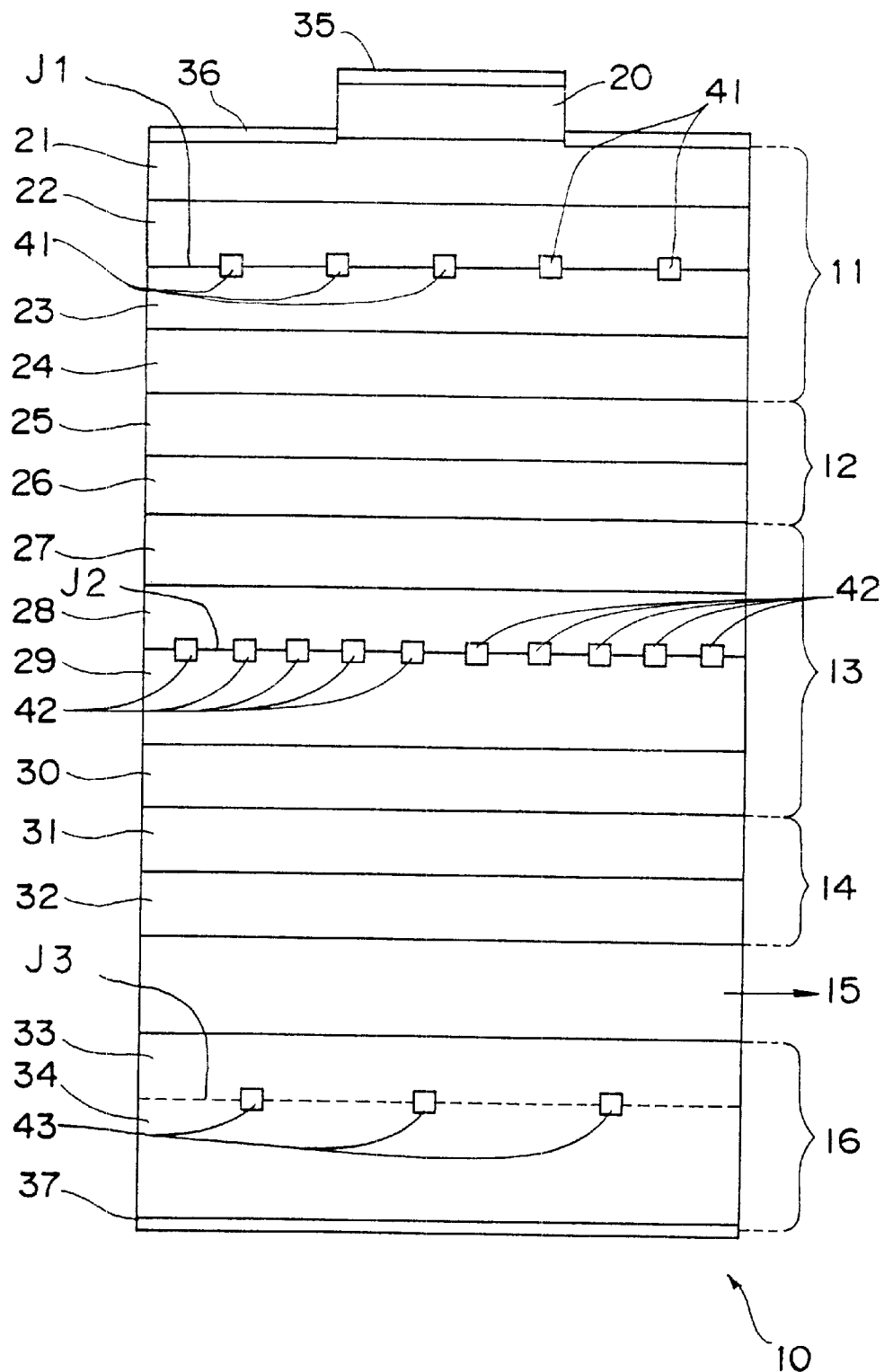
FIG. 13 is a sectional view of a bypass-function added MJ stacked type solar cell which is a fourth embodiment of the present invention.

In this fourth embodiment, as shown in FIG. 13, the most ten $p^+$ regions 42 are formed in the middle cell 13. Also, five $p^+$ regions 41 are formed in the top cell 11, and three $p^+$ regions 43 are formed in the bottom cell 16.

This fourth embodiment is effective, for example, when a partial shadow of a relatively small area can occur onto the solar cell module. This is because when a reverse bias voltage is applied with light impinging on part of the MJ cell, it is often the case that the reverse bias voltage is applied to a cell having a relatively small photoproduction current.

In the above second, third and fourth embodiments, as in the first embodiment, the $p^+$ regions 41, 42, 43 are so shaped as to project into the n regions and the p regions constituting the pn junction planes J1, J2, J3, respectively.

Also, planar positions where these $p^+$ regions 41, 42, 43 are formed may be uniformized for each of the sub-cells 11, 13, 16. However, in order to improve the controllability of ion implantation depth during the manufacture, it is desirable that the planar positions of the $p^+$ regions 41, 42, 43 do not overlap among the sub-cells 11, 13, 16.

Figure 14:
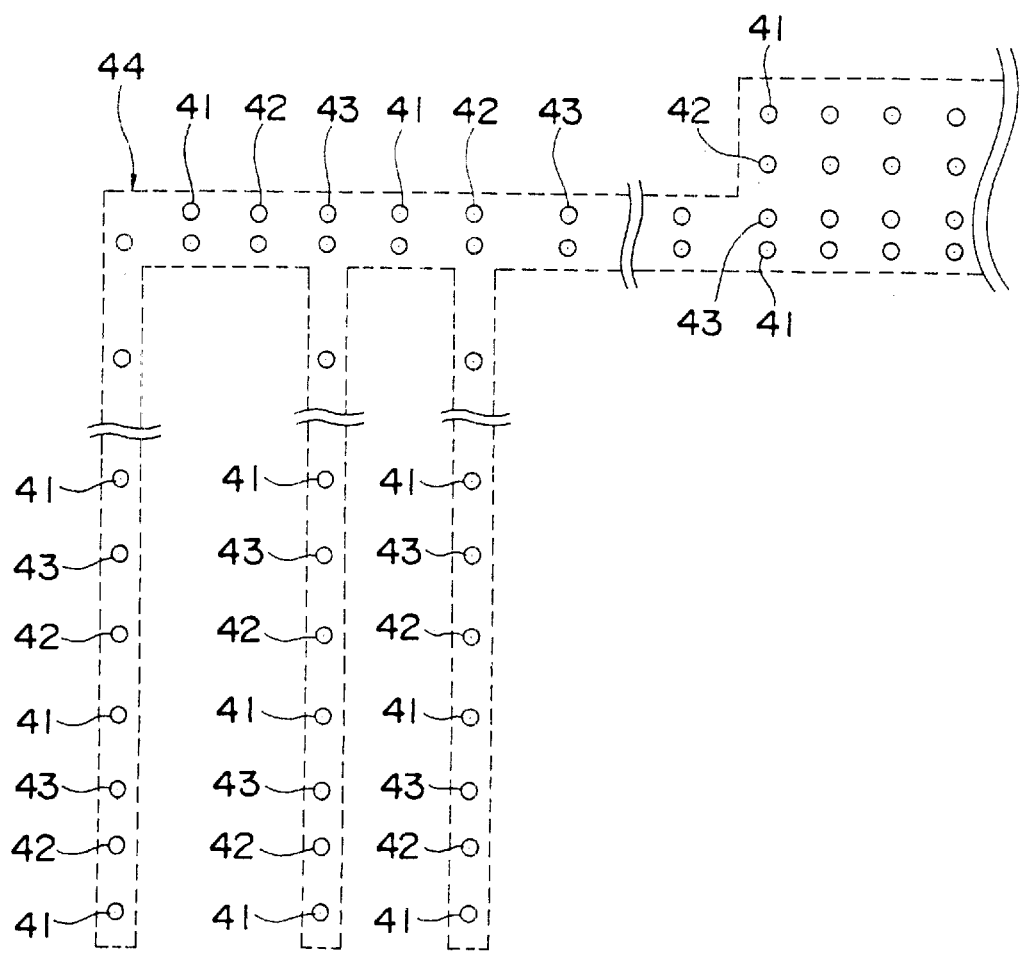
FIG. 14 is a plan view for explaining the position where the third region is formed in the second, third and fourth embodiments.

Also, by forming the $p^+$ regions 41, 42, 43 at positions under the electrodes of the light-receiving surface, the conversion efficiency can be enhanced as a whole of the cell. In this case, for example as shown in FIG. 14, it is appropriate to form the $p^+$ regions 41, 42, 43 for the sub-cells 11, 13, 16, respectively, within a grid-electrode forming area 44 of the light-receiving surface. In FIG. 14, the positions of the $p^+$ regions 41, 42, 43 in the grid-electrode forming area 44 are schematically shown, where the $p^+$ regions 41, 42, 43 are shifted from one another in a direction vertical to the drawing sheet.

For the formation of the $p^+$ regions 41, 42, 43 of group III-V compound semiconductors, it is effective to implant group II elements such as Be, Cd, Mg and Zn.

In the case of solar cells of a p on n construction as viewed from the light-receiving surface side, for the formation of $n^+$ regions as the third region, it is effective to implant group VI elements such as S, Se and Te, or Si.

Also, with respect to the Ge substrate, the implantation of group III elements such as B, Al, Ga and In is effective for the formation of $p^+$ regions, and the implantation of group V elements such as N, P, As and Sb is effective for the formation of the $n^+$ regions.

Also, in order to enhance the rate of activation of implanted ions, wafers may be heated during the ion implantation, or may be annealed after the ion implantation. During the heat treatment, in order to prevent constituent elements from dissociating from the surface, for example, a two-layered cap composed of $Si_3N_4$ and $SiO_2$ may be formed at the surface, or for example, an annealing without any cap may be done under a vapor pressure of constituent elements such as an As atmosphere.

Also, after ion implantation, places of the implantation may be heated with laser or electron beams. In particular, when the p regions 41, 42, 43 are formed under the electrode-forming positions of the light-receiving surface, portions which have been damaged by the implantation and recovered by beam annealing can be limited to under the electrodes, so that the parts of the light-receiving surface other than under the electrodes are free from any influences. This is desirable in maintaining the high conversion efficiency of the MJ cells. The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A bypass-function added solar cell comprising:
   a first-conductive-type first region;
   a second-conductive-type second region formed on a light-receiving surface side of the first-conductive-type first region;

a first-conductive-type third region which is formed at part of a pn junction plane where the first region and the second region abut each other so that the third region is provided over the first region and the second region and projects into both the first region and the second region, the third region being higher in impurity concentration than the first-conductive-type first region; and wherein the first-conductive-type third region projects into the second region but does not reach a surface of the second region that is closest to light-receiving surface side electrodes of the solar cell.

2. The bypass-function added solar cell according to claim 1, wherein a plurality of the first-conductive-type third regions are provided.

3. The bypass-function added solar cell according to claim 1, wherein at least one of the light-receiving surface side electrodes directly contacts the second region and is formed above the third region.

4. The bypass-function added solar cell according to claim 1, wherein
the first-conductive-type third region is formed into a dotted or linear shape.

5. The bypass-function added solar cell according to claim 3, wherein
the first-conductive-type third region is formed into a dotted or linear shape.

6. A method for manufacturing the bypass-function added solar cell as defined in claim 1, comprising:
an ion implantation step of implanting ions into the first-conductive-type first region to thereby form the first-conductive-type third region higher in impurity concentration than the first-conductive-type first region so that the third region is projected into both the first region and the second region.

7. The method for manufacturing the bypass-function added solar cell according to claim 6, wherein
in the ion implantation step, any one of boron, gallium, aluminum and indium is used as a doping material.

8. The method for manufacturing the bypass-function added solar cell according to claim 6, further comprising:
after the ion implantation step, forming the second-conductive-type second region by a thermal diffusion process and, simultaneously therewith, activating the third region.

9. The method for manufacturing the bypass-function added solar cell according to claim 6, wherein in the ion implantation step, ion implantation is performed with a photosensitive resin used as a masking material to thereby form the third region into an island shape.

10. The method for manufacturing the bypass-function added solar cell according to claim 6, wherein
in the ion implantation step,
an ion beam controlled to a specified area is implanted to thereby form the third region.

11. A bypass-function added multi-junction stacked solar cell in which the bypass-function added solar cell as defined in claim 1 is stacked, in a plural number as sub-cells, in series along a direction of incidence of light.

12. A bypass-function added multi-junction stacked solar cell in which the bypass-function added solar cell as defined in claim 2 is stacked, in a plural number as sub-cells, in series along a direction of incidence of light.

13. A bypass-function added multi-junction stacked solar cell in which the bypass-function added solar cell as defined in claim 4 is stacked, in a plural number as sub-cells, in series along a direction of incidence of light.

14. The bypass-function added multi-junction stacked solar cell according to claim 11, wherein a light-receiving surface side electrode in abutment on part of the second region is formed just above the third region.

15. The bypass-function added multi-junction stacked solar cell according to claim 11, wherein active layer portions of the solar cells as sub-cells comprise a group III-V compound semiconductor.

16. The bypass-function added multi-junction stacked solar cell according to claim 11, wherein the number of third regions differ from sub-cell to sub-cell.

17. The bypass-function added multi-junction stacked solar cell according to claim 14, wherein the number of third regions differ from sub-cell to sub-cell.

18. The bypass-function added multi-junction stacked solar cell according to claim 15, wherein the number of third regions differ from sub-cell to sub-cell.

19. The bypass-function added multi-junction stacked solar cell according to claim 11, wherein a number of third regions formed in a top cell positioned closest to the light-receiving surface is the largest among the sub-cells.

20. The bypass-function added multi-junction stacked solar cell according to claim 14, wherein a number of third regions formed in a top cell positioned closest to the light-receiving surface is the largest among the sub-cells.

21. The bypass-function added multi-junction stacked solar cell according to claim 15, wherein a number of third regions formed in a top cell positioned closest to the light-receiving surface is the largest among the sub-cells.

22. The bypass-function added multi-junction stacked solar cell according to claim 11, wherein a number of third regions formed in a sub-cell of the stack that is the smallest in production current density during photo-irradiation is the largest.

23. The bypass-function added multi-junction stacked solar cell according to claim 14, wherein a number of third regions formed in a sub-cell of the stack that is the smallest in production current density during photo-irradiation is the largest.

24. The bypass-function added multi-junction stacked solar cell according to claim 15, wherein a number of third regions formed in a sub-cell of the stack that is the smallest in production current density during photo-irradiation is the largest.

25. The bypass-function added multi-junction stacked solar cell according to claim 16, wherein positions on cell planes where the third regions are formed are uniform regardless of positions of the light-receiving surface side electrodes.

26. The bypass-function added multi-junction stacked solar cell according to claim 19, wherein positions on cell planes where the third regions are formed are uniform regardless of positions of light-receiving surface side electrodes.

27. The bypass-function added multi-junction stacked solar cell according to claim 22, wherein positions on cell planes where the third regions are formed are uniform regardless of positions of light-receiving surface side electrodes.

28. The bypass-function added multi-junction stacked solar cell according to claim 16, wherein positions on cell planes where the third regions are formed are positions under light-receiving surface side electrodes.

29. The bypass-function added multi-junction stacked solar cell according to claim 19, wherein positions on cell planes where the third regions are formed are positions under light-receiving surface side electrodes.

30. The bypass-function added multi-junction stacked solar cell according to claim 22, wherein positions on cell planes where the third regions are formed are positions under light-receiving surface side electrodes.

31. The bypass-function added multi-junction stacked solar cell according to claim 16, wherein among the individual sub-cells, positions where the third regions are formed on their cell planes are positions different from one another under light-receiving surface side electrodes.

32. The bypass-function added multi-junction stacked solar cell according to claim 19, wherein among the individual sub-cells, positions where the third regions are formed on their cell planes are positions different from one another under light-receiving surface side electrodes.

33. The bypass-function added multi-junction stacked solar cell according to claim 22, wherein among the individual sub-cells, positions where the third regions are formed on their cell planes are positions different from one another under light-receiving surface side electrodes.

34. A method for manufacturing the bypass-function added multi-junction stacked solar cell as defined in claim 28, the method comprising:

after forming the third regions at positions under the light-receiving surface side electrodes, activating these third regions by beam annealing.

35. A method for manufacturing the bypass-function added multi-junction stacked solar cell as defined in claim 31, the method comprising:

after forming the third regions at positions under the light-receiving surface side electrodes, activating these third regions by beam annealing.

36. The method for manufacturing the bypass-function added solar cell according to claim 6, wherein ion implantation material is one or a plurality of Be, Cd, Mg, Zn and C, or a combination of one or a plurality of Be, Cd, Mg, Zn and C and one of B, Al, Ga and In.

37. The method for manufacturing the bypass-function added solar cell according to claim 6, wherein ion implantation material for use in said ion implantation step is one or a plurality of S, Se, Te and Si, or a combination of one or a plurality of S, Se, Te and Si and one of N, P, As and Sb.

38. A bypass-function added solar cell comprising:

a first-conductive-type first region;

a second-conductive-type second region formed on a light-receiving surface side of the first-conductive-type first region;

a first-conductive-type third region which is formed at part of a pn junction plane where the first region and the second region abut each other so that the third region is provided over part of the first region and the second region and projects into both the first region and the second region, the third region being higher in impurity concentration than the first-conductive-type first region; and wherein the first-conductive-type third region projects into both the first and second regions but does not extend all the way through either of the first and second regions.

* * * * *